United States Patent
Yoon et al.

(10) Patent No.: US 8,841,154 B2
(45) Date of Patent: Sep. 23, 2014

(54) METHOD OF MANUFACTURING FIELD EFFECT TYPE COMPOUND SEMICONDUCTOR DEVICE

(71) Applicant: Electronics and Telecommunications Research Institute, Daejeon (KR)

(72) Inventors: Hyung Sup Yoon, Daejeon (KR); Byoung-Gue Min, Daejeon (KR); Jong-Won Lim, Daejeon (KR); Ho Kyun Ahn, Daejeon (KR); Jong Min Lee, Daejeon (KR); Seong-il Kim, Daejeon (KR); Jae Kyoung Mun, Daejeon (KR); Eun Soo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/916,006

(22) Filed: Jun. 12, 2013

(65) Prior Publication Data

US 2014/0017885 A1 Jan. 16, 2014

(30) Foreign Application Priority Data

Jul. 11, 2012 (KR) .................. 10-2012-0075571

(51) Int. Cl.
*H01L 21/00* (2006.01)
*H01L 21/28* (2006.01)

(52) U.S. Cl.
CPC .............................. *H01L 21/28008* (2013.01)
USPC ......... 438/47; 438/46; 438/574; 257/E21.205

(58) Field of Classification Search
None
See application file for complete search history.

(56) References Cited

U.S. PATENT DOCUMENTS 5,231,040 A * 7/1993 Shimura ..................... 438/72
5,976,920 A * 11/1999 Nakano et al. ............. 438/172

(Continued)

FOREIGN PATENT DOCUMENTS

JP 63-015475 A 1/1988
JP 63-193570 A 8/1988

(Continued)

OTHER PUBLICATIONS

I. Hanyu et al., "Super Low-Noise HEMTs with a T-Shaped WSi$_x$ Gate", Electronics Letters, Oct. 13, 1988, pp. 1327-1328, vol. 24, No. 21.

(Continued)

*Primary Examiner* — Charles Garber
*Assistant Examiner* — Evren Seven
(74) *Attorney, Agent, or Firm* — Rabin & Berdo, P.C.

(57) ABSTRACT

Disclosed is a method of manufacturing a field effect type compound semiconductor device in which leakage current of a device is decreased and breakdown voltage is enhanced. The method of manufacturing a field effect type compound semiconductor device includes: stacking an active layer and an ohmic layer on a substrate and forming a first oxide layer on the ohmic layer; forming a mesa region in predetermined regions of the first oxide layer, the ohmic layer, and the active layer; planarizing the mesa region after forming a nitride layer by evaporating a nitride on the mesa region; forming an ohmic electrode on the first oxide layer; forming a minute gate resist pattern after forming a second oxide layer on a semiconductor substrate in which the ohmic electrode is formed and forming a minute gate pattern having a under-cut shaped profile by dry-etching the first oxide layer, the nitride layer, and the second oxide layer; forming a gate recess region by forming a head pattern of a gamma gate electrode on the semiconductor substrate; and forming the gamma gate electrode by evaporating refractory metal on the semiconductor substrate in which the gate recess region is formed.

8 Claims, 5 Drawing Sheets

(56) References Cited

U.S. PATENT DOCUMENTS

| | | | |
|---|---|---|---|
| 6,042,975 A * | 3/2000 | Burm et al. | 430/22 |
| 6,160,274 A * | 12/2000 | Folkes | 257/191 |
| 6,204,102 B1 * | 3/2001 | Yoon et al. | 438/182 |
| 6,426,523 B1 * | 7/2002 | Yamaguchi et al. | 257/192 |
| 6,627,473 B1 * | 9/2003 | Oikawa et al. | 438/46 |
| 6,720,200 B2 * | 4/2004 | Yamaguchi et al. | 438/47 |
| 6,838,325 B2 * | 1/2005 | Whelan et al. | 438/172 |
| 6,867,078 B1 * | 3/2005 | Green et al. | 438/167 |
| 7,012,286 B2 * | 3/2006 | Inai et al. | 257/192 |
| 7,229,903 B2 * | 6/2007 | Li et al. | 438/571 |
| 7,470,941 B2 * | 12/2008 | Micovic et al. | 257/192 |
| 7,598,131 B1 * | 10/2009 | Micovic et al. | 438/172 |
| 7,692,222 B2 * | 4/2010 | Tabatabaie et al. | 257/284 |
| 7,732,859 B2 * | 6/2010 | Anderson et al. | 257/328 |
| 7,910,955 B2 * | 3/2011 | Endoh et al. | 257/194 |
| 8,043,687 B2 * | 10/2011 | Kamins et al. | 428/172 |
| 2002/0187623 A1 * | 12/2002 | Oikawa et al. | 438/590 |
| 2008/0182369 A1 * | 7/2008 | Jeong et al. | 438/172 |

FOREIGN PATENT DOCUMENTS

| | | |
|---|---|---|
| JP | 2003-115499 A | 4/2003 |
| KR | 10-2001-0058252 A | 7/2001 |

OTHER PUBLICATIONS

E. Y. Change et al., "Submicron T-Shaped Gate HEMT Fabrication Using Deep-UV Lithography", IEEE Electron Device Letters, Aug. 1994, pp. 277-279, vol. 15, No. 8.

\* cited by examiner

METHOD OF MANUFACTURING FIELD EFFECT TYPE COMPOUND SEMICONDUCTOR DEVICE

CROSS-REFERENCE TO RELATED APPLICATIONS

This application is based on and claims priority from Korean Patent Application No. 10-2012-0075571, filed on Jul. 11, 2012, with the Korean Intellectual Property Office, the disclosure of which is incorporated herein in its entirety by reference.

TECHNICAL FIELD

The present disclosure relates to a method of manufacturing a field effect type compound semiconductor device, and more particularly, to a method of manufacturing a field effect type compound semiconductor device in which leakage current of a device is decreased and breakdown voltage is enhanced.

BACKGROUND

In a method of manufacturing a field effect type compound semiconductor device in the related art, a mesa isolating method of etching a semiconductor substrate is primarily used, and as a result, leakage current of a compound semiconductor device is increased and breakdown voltage is decreased due to occurrence electrical contact between a gate electrode and a channel layer of a mesa region. There occurs a problem that T gate metal is broken at a narrow opening portion of a gate pattern when a T gate electrode is formed by using an existing PMMA copolymer. In addition, when gate metal is evaporated to be thick in order to reduce resistance of the gate electrode, a T type resist pattern is deformed due to an increase in temperature of a vacuum evaporation apparatus, and as a result, it is difficult to form the T gate electrode stably and reproducibility of making a semiconductor device also deteriorates.

FIGS. 1A to 1D are vertical cross-sectional views of a device for each process to describe a making process and a structure of a semiconductor device having the T gate electrode in the related art and simply illustrates a method of manufacturing a field effect type compound semiconductor device such as indium-phosphorus (InP) high-electron mobility transistor (HEMT), a metal-semiconductor field effect transistor (MESFET), and the like.

First, as illustrated in FIG. 1A, a semi-insulating indium-phosphorus (InP) substrate 1, a InAlAs buffer layer 2, a InGaAs channel layer 3, an InAlAs spacer layer 4, an electron supply layer 5, a second InAlAs schottky layer 6, a second etching stop layer 7, a first InAlAs schottky layer 8, a first etching stop layer 9, are an N type InGaAs ohmic layer 10 are formed in sequence.

Subsequently, as illustrated in FIG. 1B, after a mesa region 11 is formed, an ohmic metal electrode 12 is formed as illustrated in FIG. 1C.

Next, as illustrated in FIG. 1D, after the T type resist pattern is formed by an electron ray exposure method by applying PMMA resist and copolymer resist, parts of an N type InGaAs ohmic layer 10 and a first AlAs etching stop layer 9 used to make a normally-on type semiconductor device are wet-etched and removed. Subsequently, in order to make the field effect type compound semiconductor device, when a first InAlAs Schottky layer 8 and a second etching stop layer 7 are etched, and PMMA resist and copolymer resist are removed by using a lift-off method after a gate metal constituted by Ti, Pt, and Au is evaporated, the field effect type compound semiconductor device having a T gate electrode 13 is made as illustrated in FIG. 1D. When the field effect type compound semiconductor device (HEMT) made by the above method is formed, electric contact occurs between the gate electrode and the channel layer of the mesa region due to mesa isolation, and as a result, the leakage current of the compound semiconductor device increases and the breakdown voltage decreases.

There occurs a problem that the T gate metal is broken at the narrow opening portion of the gate pattern when the T gate electrode is formed by using the PMMA copolymer and copolymer resist. In addition, when gate metal is evaporated to be thick in order to reduce the resistance of the gate electrode, the T type resist pattern is deformed due to the increase in temperature of the vacuum evaporation apparatus, and as a result, it is difficult to form the T gate electrode stably and reproducibility and reliability of making the semiconductor device deteriorate.

SUMMARY

The present disclosure has been made in an effort to provide a method of manufacturing a field effect type compound semiconductor device in which an increase phenomenon of leakage current and a decrease phenomenon of breakdown voltage of a compound semiconductor device caused due to electric contact between a gate electrode and a channel layer of a mesa region are enhanced in making the compound semiconductor device by using mesa type device isolation.

An exemplary embodiment of the present disclosure provides a method of manufacturing a field effect type compound semiconductor device including: stacking an active layer and an ohmic layer on a substrate and forming a first oxide layer on the ohmic layer; vertically forming a mesa region in predetermined regions of the first oxide layer, the ohmic layer, and the active layer; planarizing the mesa region after forming a nitride layer by evaporating a nitride on the mesa region; forming an ohmic electrode on the first oxide layer; forming a minute gate resist pattern after forming a second oxide layer on a semiconductor substrate in which the ohmic electrode is formed and forming a minute gate pattern having a under-cut shaped profile by dry-etching three-layer insulating layers formed the first oxide layer, the nitride layer, and the second oxide layer; forming a gate recess region by forming a head pattern of a gamma gate electrode on the semiconductor substrate in which the minute gate pattern is formed; and forming the gamma gate electrode by evaporating refractory metal on the semiconductor substrate in which the gate recess region is formed.

The active layer may be formed by sequentially stacking a buffer layer, a channel layer, a spacer layer, an electron supply layer, a Schottky layer, and an etching stop layer.

In the planarizing of the mesa region, the mesa region may be coated with an SOG thin film and heat-treated.

The forming of the ohmic electrode may include forming an ohmic pattern by using a photolithography method, sequentially dry-etching the nitride layer and the oxide layer in accordance with the ohmic pattern, and forming an ohmic electrode at places in which the nitride layer and the oxide layer are etched.

The forming of the minute gate pattern may include forming the second oxide layer on the semiconductor substrate in which the ohmic electrode is formed, coating the second oxide layer with a PMMA thin film and forming a minute gate resist pattern by a photolithography method, forming a under-cut shaped profile by a dry-etching method of the second oxide layer, and forming a minute gate pattern by sequentially dry-etching the nitride layer on the etching stop layer and the first oxide layer.

The forming of the gate recess region may include forming a head pattern of a gamma gate electrode on the semiconductor substrate in which the gate recess region is formed by the photolithography method, and forming the under-cut shaped profile by sequentially wet-etching the ohmic layer and the etching stop layer.

The forming of the gamma gate electrode may include sequentially evaporating one or more layers of refractory metals, and removing the PMMA thin film and the copolymer resist by a lift-off method.

The method of manufacturing a field effect type compound semiconductor device may further include forming a protective layer by evaporating the nitride layer on the semiconductor layer in which the gamma gate electrode is formed by using a plasma enhanced chemical vapor deposition (PCVD) method, after the forming of the gamma gate electrode.

According to the exemplary embodiment of the present disclosure, the leakage current of the field effect type compound semiconductor device can be decreased and the breakdown voltage of the field effect type compound semiconductor device can be enhanced.

According to the exemplary embodiment of the present disclosure, a device having higher reproducibility and reliability and a more improved DC/RF characteristic can be made.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1A:
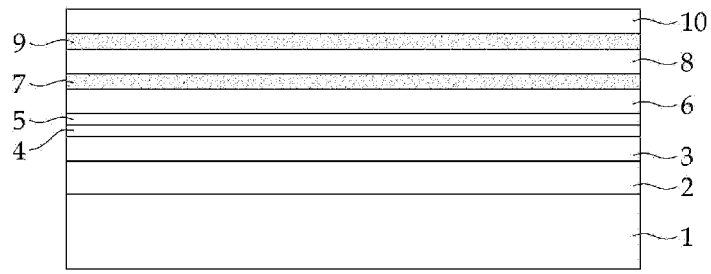
FIGS. 1A to 1D are vertical cross-sectional views of a device for each process to describe a making process and a structure of a semiconductor device having a T gate electrode in the related art.
Figure 1B:
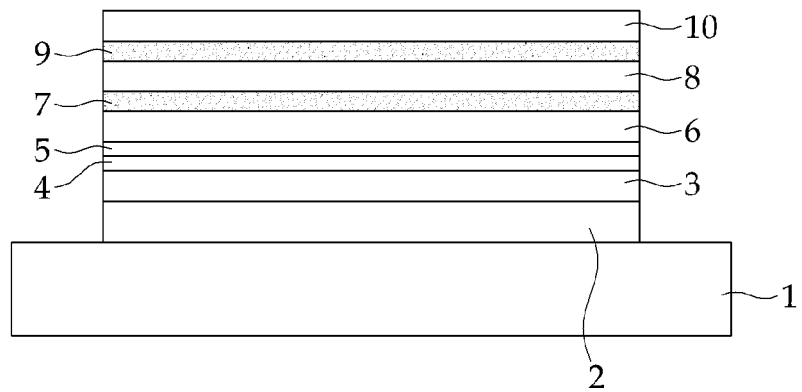
Figure 1C:
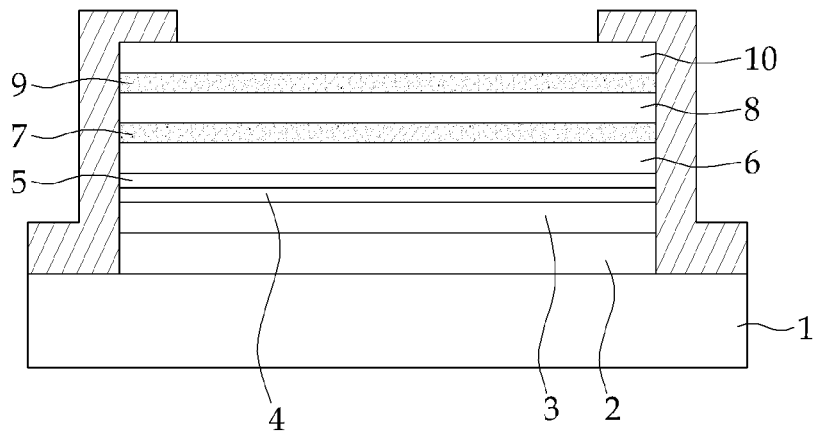
Figure 1D:
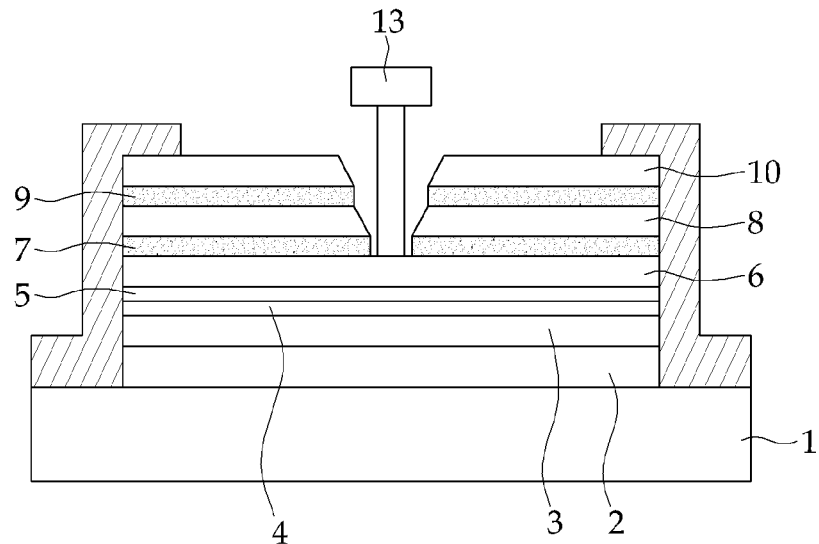

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, exemplary embodiments of the present disclosure will be described in detail with reference to the accompanying drawings. A configuration of the present disclosure and an operational effect thereof will be clearly understood through the following detailed description. Prior to the detailed description of the present disclosure, it should be noted that the same components refer to the same reference numerals anywhere as possible in the drawings and the detailed description will be omitted when known configurations may make the subject matter of the present disclosure unnecessarily ambiguous.

A field effect type transistor used in the present disclosure has a more excellent speed characteristic than a silicon semiconductor device to be widely used for an application device in a microwave or millimeterwave band. The field effect type transistor may acquire high breakdown voltage by reducing fields of a gate electrode and a drain electrode and may include a field electrode that reduces capacitance generated between the gate electrode and the drain electrode.

FIGS. 2A to 2H are vertical cross-sectional views of a device for each process to describe a making process and a structure of a semiconductor device having a gamma gate electrode according to an exemplary embodiment of the present disclosure.

Referring to FIGS. 2A to 2H, the method of manufacturing a semiconductor device having a gamma gate electrode includes: stacking an active layer 3 and an ohmic layer 4 on a substrate 20 and forming a first oxide layer 50 on the ohmic layer 40; vertically forming a mesa region 60 in predetermined regions of the first oxide layer 50, the ohmic layer 40, and the active layer 30; planarizing the mesa region 60 after forming a nitride layer 61 by evaporating a nitride on the mesa region 61; forming an ohmic electrode 70 on the first oxide layer 50; forming a minute gate resist pattern 72 after forming a second oxide layer 71 on a semiconductor substrate in which the ohmic electrode 70 is formed and forming a minute gate pattern having a under-cut shaped profile 73 by dry-etching three-layer insulating layers formed the first oxide layer 50, the nitride layer 61, and the second oxide layer 71; forming a gate recess region 75 by forming a head pattern of a gamma gate electrode 80 on the semiconductor substrate in which the minute gate pattern is formed by applying copolymer resist; and forming the gamma gate electrode 80 by evaporating refractory metal on the semiconductor substrate in which the gate recess region is formed.

Figure 2A:
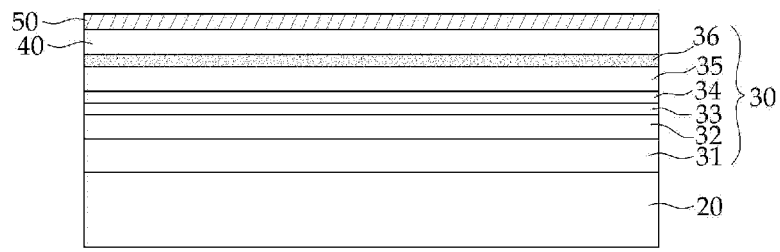
FIGS. 2A to 2H are vertical cross-sectional views of a device for each process to describe a making process and a structure of a semiconductor device having a gamma gate electrode according to an exemplary embodiment of the present disclosure.

First, as illustrated in FIG. 2A, an active layer 30 and an ohmic layer 40 are formed on a semi-insulating substrate 20 and the first oxide layer 50 is formed on the ohmic layer 40.

The substrate 20 may include any one semiconductor substrate of gallium arsenide (GaAs), indium-phosphorus (InP), gallium nitrogen (GaN), silicon germanium (SiGe), silicon-carbide (SiC), and indium-gallium-arsenide (InGaAs). The substrate 20 may include insulative substrate such as glass, sapphire and quartz.

The active layer 30 may be formed by an epitaxial growth method including a molecular beam epitaxy (MBE) method or a metal-organic chemical vapor deposition (MOCVD) method. The active layer 30 is a structure formed by stacking a buffer layer 31, a channel layer 32, a spacer layer 33, an electron supply layer 34, a Schottky layer 35, and an etching stop layer 36.

The channel layer 32 has a band where moves of charges occur in field effect type transistor, and the channel layer 32 may include a two dimensional electron gas (2DEG). For example, the channel layer 32 may include epitaxially grown indium-gallium-arsenide (InGaAs) in which impurities are not doped.

The spacer layer 33 includes indium-aluminum-arsenide (InAlAs) and may be thinner than the channel layer 32.

The electron supply layer 34 may supply electric charges transited to the channel layer 32 through the spacer layer 33. For example, the electron supply layer 34 includes aluminum-gallium-arsenide (n+ AlGaAs) layer or silicon layer (Si planar doping) and may be doped with n type conductive impurities.

The Schottky layer 35 may include indium-aluminum-arsenide (InAlAs) which is one of wide band gap ternary compound semiconductor materials configured by a Schottky junction (junction between a semiconductor layer and metal connected with the semiconductor layer).

The ohmic layer 40 may reduce contact resistance by forming ohmic-contact with a source electrode and a drain electrode. For example, the ohmic layer 40 may include indium-gallium-arsenide (InGaAs) doped with the n type conductive impurities.

Figure 2B:
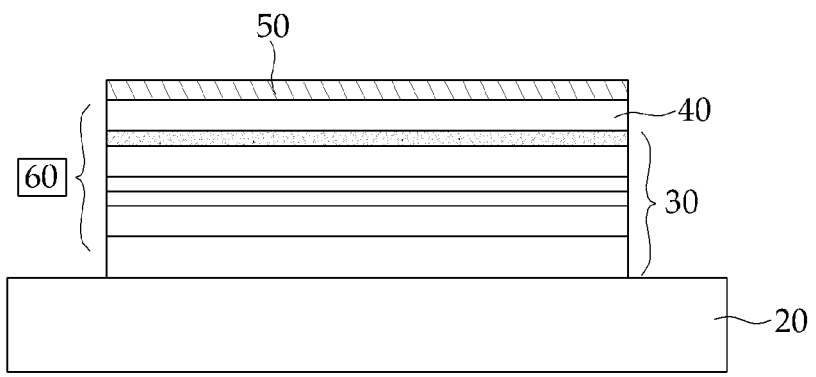
Figure 2C:
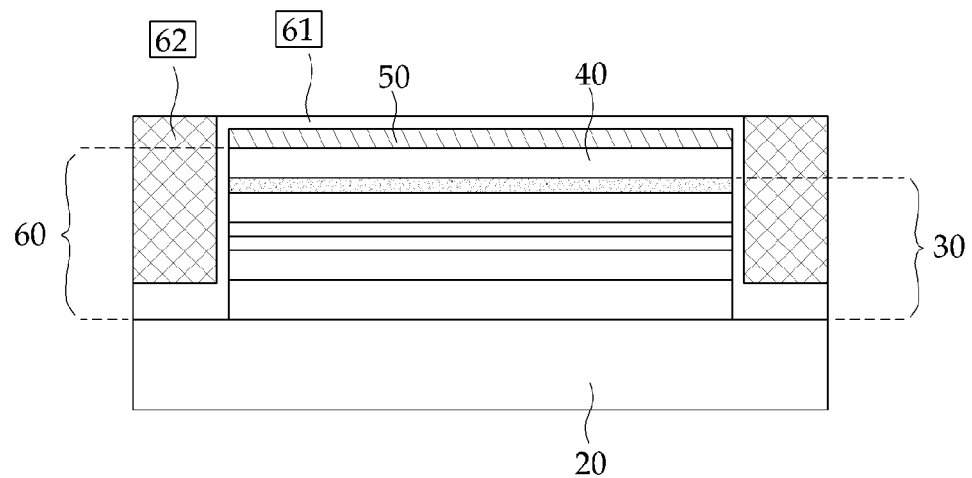

Subsequently, as illustrated in FIG. 2B, after the mesa region 60 is formed on both sides on surface of the semiconductor substrate formed in FIG. 2A, a nitride layer 61 is evaporated on the mesa region 60 and the first oxide layer 50 to be thin as illustrated in FIG. 2C. Thereafter, a spin on glass (SOG) thin film is spin-coated by using a spin thin-film coating apparatus and heat-treated at approximately 450° C. to form an oxide layer 62, that is, an insulating layer. The mesa region 60 is planarized through this step.

Figure 2D:
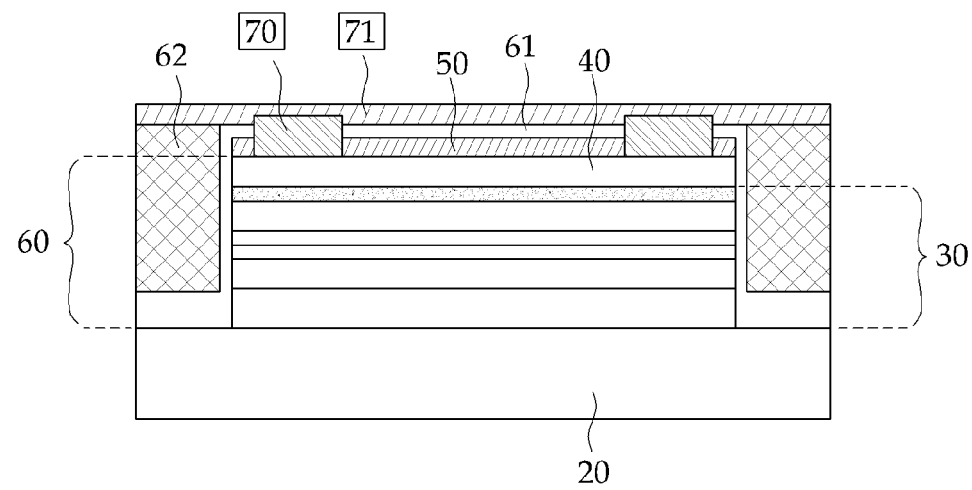

Subsequently, as illustrated in FIG. 2D, after an ohmic pattern is formed by a photolithography method, and the nitride layer 61 and the oxide layer 50 are sequentially removed through dry etching according to an ohmic pattern, the ohmic electrode 70 is formed at places where the nitride layer 61 and the oxide layer 50 are removed, and the second oxide layer 71 is evaporated. Herein, the dry etching means an etching process using reaction by gas plasma without using chemicals used in wet etching, in minute processing.

Figure 2E:
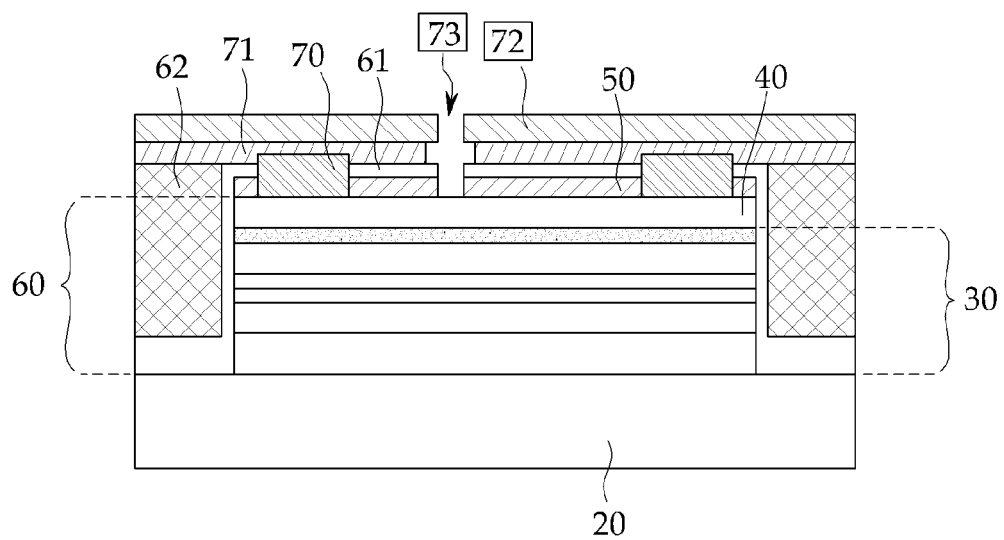

Subsequently, as illustrated in FIG. 2E, after a deep-sub-micron (DSM) class minute gate resist pattern 72 is formed by coating a single PMMA thin film and using an electron ray lithography exposure apparatus, a under-cut shaped profile 73 is formed by dry-etching the second oxide layer 71 by means of $CF_4$ gas, and the like. A minute gate pattern (oxide layer/nitride layer/oxide layer) of which an opening portion is wide is formed by sequentially dry-etching parts of the nitride layer 61 and the first oxide layer 50 by means of $CF_4$ gas.

Figure 2F:
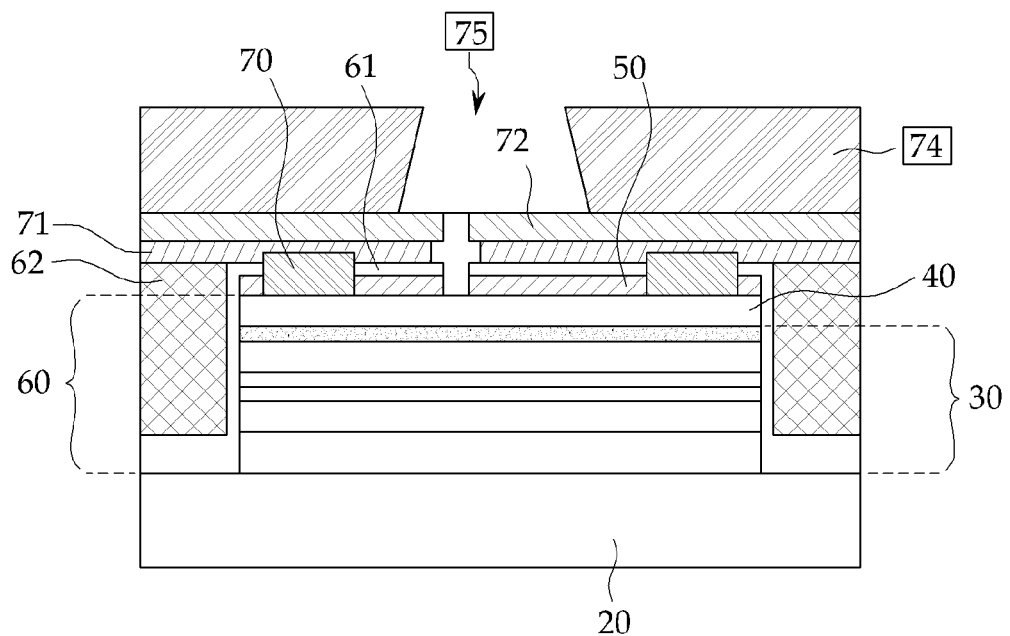

Next, as illustrated in FIG. 2F, a head pattern 74 of a gamma (Γ) gate electrode having an asymmetric structure is formed by the photolithography method and a under-cut shaped profile 75 is formed by sequentially wet-etching the ohmic layer 40 and the etching stop layer 36. In this case, a succinic acid solution and a hydrochloric acid (HCl) solution may be used as an etching solution during wet etching.

Figure 2G:
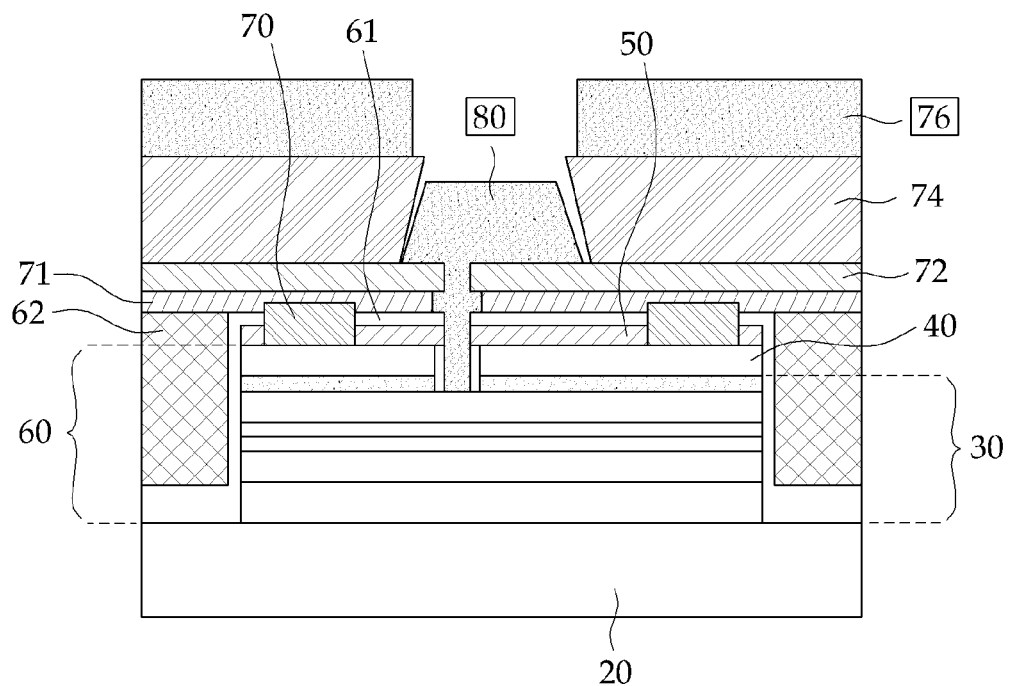

Next, as illustrated in FIG. 2G, multilayered refractory metals 80 and 76 are evaporated by using the head pattern 74 of the gamma (Γ) gate electrode as a mask. In more detail, after Pt metal is evaporated to be thin with a thickness of 5 nm, and Ti, Mo, and Au metals are sequentially evaporated, when the PMMA thin film and the copolymer resist are removed by the lift-off method, the field effect type compound semiconductor device having the gamma (Γ) gate electrode 80 is made as illustrated in FIG. 2G.

Figure 2H:
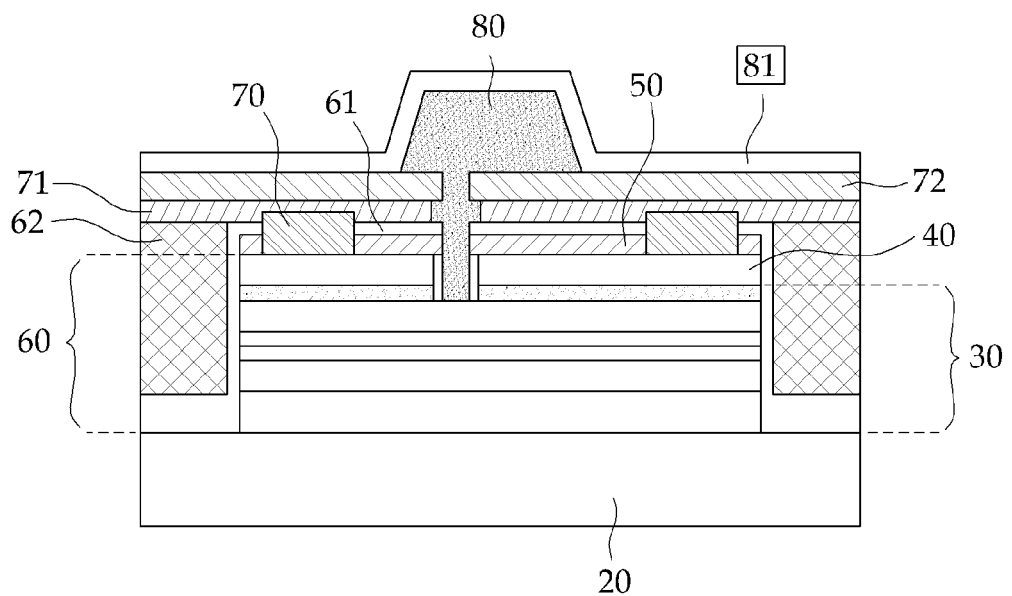

Last, as illustrated in FIG. 2H, after the gamma (Γ) gate electrode is manufactured, the nitride layer 81 is evaporated by a plasma enhanced chemical vapor deposition (PECVD) method at 300 to 350° C. to protect the field effect type compound semiconductor device.

Consequently, a high-performance compound semiconductor device in which the leakage current of the field effect type compound semiconductor device is decreased and the breakdown voltage of the field effect type compound semiconductor device is enhanced may be stably made.

Steps of the process of the present disclosure is not limited to steps by a completely time-series sequence and disclosed to easily understand the present disclosure according to a sequence applied to a common semiconductor process, and a process sequence of the present disclosure can be changed or modified as necessary. A nitride semiconductor means various semiconductors including nitride and is not limited to the semiconductor applied in the exemplary embodiment.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of manufacturing a field effect type compound semiconductor device, comprising:
    stacking an active layer and an ohmic layer on a substrate and forming a first oxide layer on the ohmic layer;
    vertically forming a mesa region in predetermined regions of the first oxide layer, the ohmic layer, and the active layer;
    planarizing the mesa region after forming a nitride layer by evaporating a nitride on the mesa region;
    forming an ohmic electrode on the first oxide layer;
    forming a minute gate resist pattern after forming a second oxide layer on a semiconductor substrate in which the ohmic electrode is formed and forming a minute gate pattern having a under-cut shaped profile by dry-etching three-layer insulating layers formed the first oxide layer, the nitride layer, and the second oxide layer;
    forming a gate recess region by forming a head pattern of a gamma gate electrode on the semiconductor substrate in which the minute gate pattern is formed; and
    forming the gamma gate electrode by evaporating refractory metal on the semiconductor substrate in which the gate recess region is formed.

2. The method of manufacturing a field effect type compound semiconductor device of claim 1, wherein the active layer is formed by sequentially stacking a buffer layer, a channel layer, a spacer layer, an electron supply layer, a Schottky layer, and an etching stop layer.

3. The method of manufacturing a field effect type compound semiconductor device of claim 1, wherein in the planarizing of the mesa region, the mesa region is coated with an SOG thin film, and heat-treated.

4. The method of manufacturing a field effect type compound semiconductor device of claim 1, wherein the forming of the ohmic electrode comprises:
    forming an ohmic pattern by using a photolithography method,
    sequentially dry-etching the nitride layer and the oxide layer in accordance with the ohmic pattern, and
    forming an ohmic electrode at places in which the nitride layer and the oxide layer are etched.

5. The method of manufacturing a field effect type compound semiconductor device of claim 1, wherein the forming of the minute gate pattern comprises:
    forming the second oxide layer on the semiconductor substrate in which the ohmic electrode is formed,
    coating the second oxide layer with a PMMA thin film and forming a minute gate resist pattern by using a photolithography method,
    forming a under-cut shaped profile by a dry-etching method of the second oxide layer, and
    forming a minute gate pattern by sequentially dry-etching the nitride layer and the first oxide layer on the etching stop layer.

6. The method of manufacturing a field effect type compound semiconductor device of claim 2, wherein the forming of the gate recess region comprises:

forming a head pattern of a gamma gate electrode on the semiconductor substrate in which the gate recess region is formed by the photolithography method, and forming the under-cut shaped profile by sequentially wet-etching the ohmic layer and the etching stop layer.

7. The method of manufacturing a field effect type compound semiconductor device of claim 5, wherein the forming of the gamma gate electrode comprises:

sequentially evaporating one or more refractory metals, and removing the PMMA thin film and the copolymer resist by a lift-off method.

8. The method of manufacturing a field effect type compound semiconductor device of claim 1, further comprising:

forming a protective layer by evaporating the nitride layer on the semiconductor layer in which the gamma gate electrode is formed by using a plasma enhanced chemical vapor deposition (PCVD) method, after the forming of the gamma gate electrode.

* * * * *